(12) United States Patent
Hsu et al.

(10) Patent No.: US 7,179,701 B2
(45) Date of Patent: Feb. 20, 2007

(54) TRANSISTOR WITH HIGH DIELECTRIC CONSTANT GATE AND METHOD FOR FORMING THE SAME

(75) Inventors: Ju-Wang Hsu, Taipei (TW); Jyu-Horng Shieh, Hsin-chu (TW); Ju-Chien Chiang, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/946,494

(22) Filed: Sep. 21, 2004

(65) Prior Publication Data

US 2006/0063322 A1    Mar. 23, 2006

(51) Int. Cl.
*H01L 21/8238* (2006.01)
*H01L 21/336* (2006.01)

(52) U.S. Cl. .................. 438/216; 438/259; 438/270; 257/E21.4; 257/E21.428

(58) Field of Classification Search ............. 438/142, 438/183–184, 197, 199–200, 216–217, 240–242, 438/275, 279, 287, 301, 581, 595, E21.444, 438/259, 270, 778; 257/E21.4, E21.409, 257/E21.424, E21.428

See application file for complete search history.

(56) References Cited

U.S. PATENT DOCUMENTS

| | | | | |
|---|---|---|---|---|
| 5,960,270 | A * | 9/1999 | Misra et al. | 438/197 |
| 6,251,763 | B1 * | 6/2001 | Inumiya et al. | 438/595 |
| 6,436,775 | B2 * | 8/2002 | Kim et al. | 438/301 |
| 6,607,950 | B2 * | 8/2003 | Henson et al. | 438/197 |
| 6,730,581 | B2 * | 5/2004 | Suguro | 438/486 |

* cited by examiner

*Primary Examiner*—Brook Kebede
*Assistant Examiner*—Phillip S. Green
(74) *Attorney, Agent, or Firm*—Duane Morris LLP (57) ABSTRACT

A semiconductor device provides a gate structure that includes a conductive portion and a high-k dielectric material formed beneath and along sides of the conductive material. An additional gate dielectric material such as a gate oxide may be used in addition to the high-k dielectric material. The method for forming the structure includes forming an opening in an organic material, forming the high-k dielectric material and a conductive material within the opening and over the organic material then using chemical mechanical polishing to remove the high-k dielectric material and conductive material from regions outside the gate region.

14 Claims, 8 Drawing Sheets

TRANSISTOR WITH HIGH DIELECTRIC CONSTANT GATE AND METHOD FOR FORMING THE SAME

FIELD OF THE INVENTION

The present invention relates, most generally to a semiconductor device and methods for forming the same. More particularly, the invention relates to a high dielectric constant transistor gate and a method for forming such a structure.

BACKGROUND

Shrinking the conventional MOSFET (metal oxide semiconductor field effect transistor) beyond the 50 nanometer technology node requires innovations to circumvent barriers due to the fundamental physics that constrain conventional MOSFETs. Continued device shrinkage requires a reduction of gate dielectric thickness. This requirement arises from two different considerations: controlling the short-channel effect, and achieving a high current drive by keeping the amount of charge induced in the channel as large as possible as the power-supply voltage decreases. It is the reduction of the equivalent electrical thickness of the gate dielectric that is important in achieving each of the aforementioned considerations.

One approach for reducing the equivalent electrical thickness of the gate dielectric is to simply reduce the physical thickness of the gate dielectric material. A shortcoming associated with this approach is that the direct tunneling current through the gate dielectric grows exponentially with decreasing physical thickness of the gate dielectric. It is considered that tunneling currents arising from silicon dioxide ($SiO_2$) gate dielectrics thinner than 0.8 nanometers cannot be tolerated, even for high-performance systems. A more favorable approach for reducing the equivalent electrical thickness of the gate dielectric is to use a gate dielectric material that has a high dielectric constant, i.e., a dielectric constant that is higher than about 3.9, the dielectric constant of $SiO_2$. A gate dielectric with a dielectric constant (k) substantially higher than that of $SiO_2$ ($k_{ox}$) will achieve a smaller equivalent electrical thickness ($t_{eq}$) than the $SiO_2$, even with a physical thickness ($t_{phys}$) larger than that of the $SiO_2$ ($t_{ox}$):

$$t_{eq} = (k_{ox}/k)t_{phys}.$$

Figure 1A:
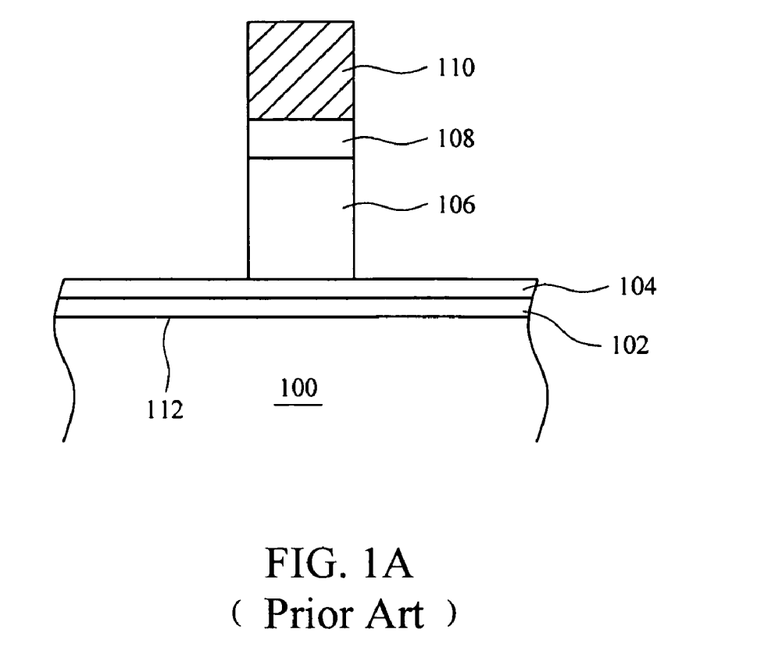
FIGS. 1A–1B depict a process sequence used to remove a high-k gate dielectric material according to the PRIOR ART.
Figure 1B:
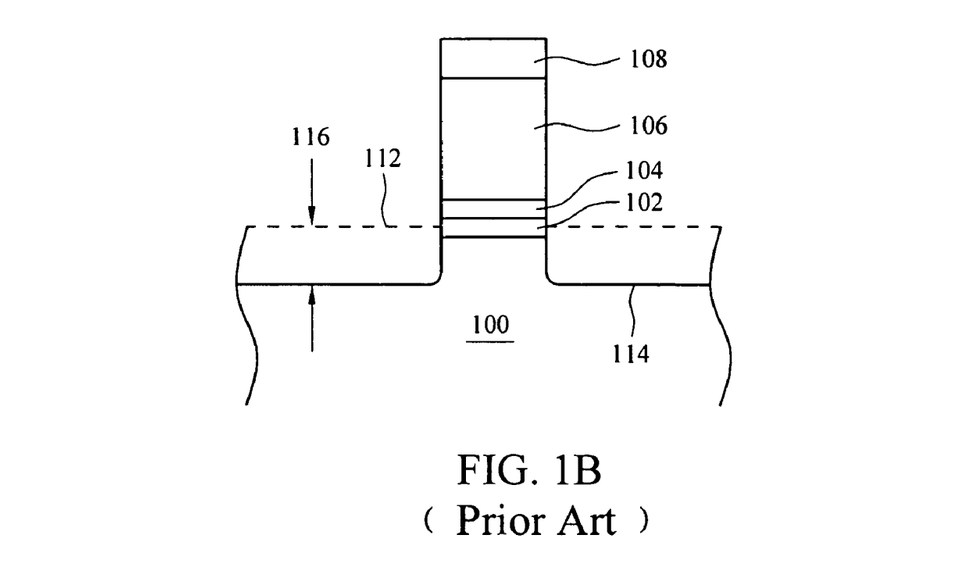

Replacing the conventional $SiO_2$ gate material with a high-dielectric constant (high-k) dielectric gate material, however, presents other challenges. One challenge associated with the use of high-k gate dielectric material is the inability to sufficiently remove such materials from the non-gate regions where they are not needed. Due to the absence of suitable etch chemistries to remove the high-k gate materials, an aggressive etch and an aggressive and extended over-etch must be used when etching to remove the high-k gate dielectric material, to ensure its complete removal. Such an approach can and often does result in recesses being produced throughout the semiconductor device, including in areas immediately adjacent to the gate region, due to the aggressive etch process. FIG. 1A shows conductive gate 106 formed after an etching process that uses photoresist 110 as a mask. The structure includes optional ARC layer 108 and conductive gate material 106 is formed over high-k gate dielectric 104 and gate oxide 102 formed over surface 112 of substrate 100. After etching the conductive gate material to form conductive gate 106, an etching process is then carried out to remove high-k gate dielectric 104 and gate oxide 102 from regions other than the gate region aligned beneath conductive gate 106. According to the prior art, aggressive etch processes with aggressive and extended overetch steps are required and typically produce receded surface 114 which is receded with respect to original surface 112 by distance 116. Residue of high-k gate dielectric 104 (not shown in FIG. 1A) may also still be present. Conventional methods therefore either produce high-k gate dielectric material residue, recesses formed due to the attack of the material over which the high-k gate dielectric material is formed, or both.

It would therefore be desirable to produce a semiconductor device and provide a method for forming the device with a high-k gate dielectric material and without the above shortcomings.

SUMMARY OF THE INVENTION

To address the above needs and in view of its purposes, an aspect of the invention provides a method for forming a semiconductor device. The method comprises forming a high-k gate dielectric material over a substrate including over a gate region, using a planarization step such as chemical mechanical polishing to remove the high-k gate dielectric material from regions other than the gate region, and forming a conductive material over the high-k gate dielectric material in the gate region.

In another aspect, provided is a semiconductor device comprising a transistor gate. The semiconductor device includes a conductive gate material formed over a channel region of a substrate. A high-k dielectric layer is interposed between the conductive gate material and the substrate and the high-k dielectric layer extends along sidewalls of the conductive gate material.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Each of the following figures is a cross-sectional view.

DETAILED DESCRIPTION

Figure 2A:
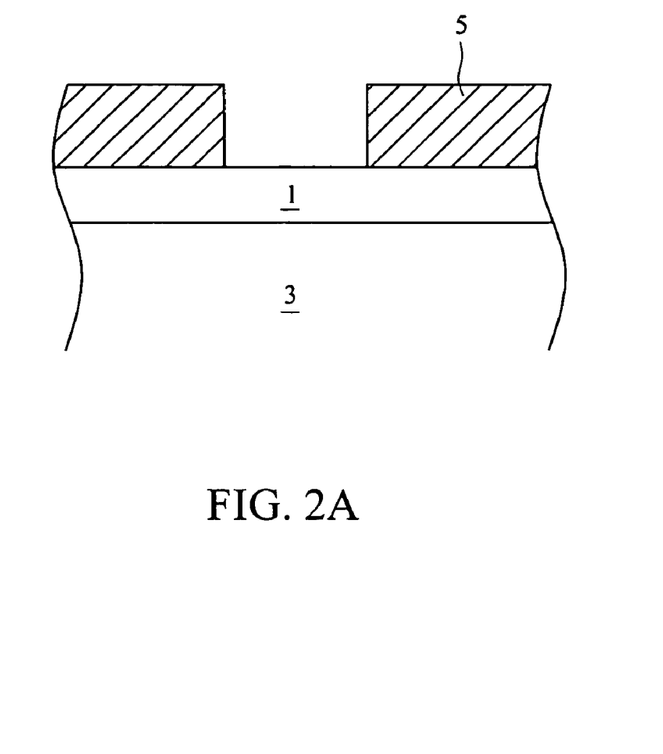
FIGS. 2A–2F show an exemplary process sequence used to form a gate structure according to the invention.

FIG. 2A shows a layer of organic material 1 formed over substrate 3. Patterned photoresist 5 is formed above organic material 1. Photoresist 5 pattern enables the formation of an opening in organic material 1 over gate region 9. Organic material 1 may be an organic low dielectric constant spin-on-polymer (SOP) material such as a fluorinated poly (arylene ether) organic polymer commercially available as FLARE from Allied Signal Corporation, 1349 Moffett Park Drive, Sunnyvale, Calif. 94089, or PAE-2 produced by Schumacher Corporation, 1969 Palomar Oaks Way, Carlsbad, Calif. 92009. A further commercial fluorinated organic poly(arylene ether) low dielectric constant spin-on-polymer (SOP) dielectric material that may be used as organic material 1 is SILK, available from Dow Chemical Co., 1712 Building, Midland, Mich. 48674. In another embodiment, APF, by Applied Materials Inc, may be used as organic material 1. Other suitable materials may be used as organic material 1, in other exemplary embodiments.

Figure 2B:
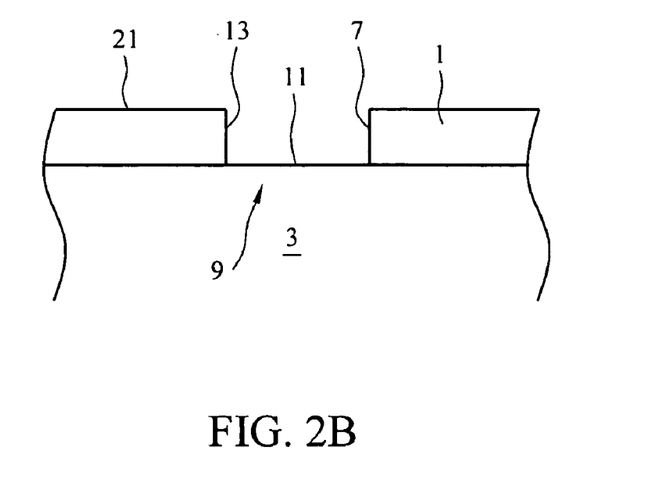
Figure 2C:
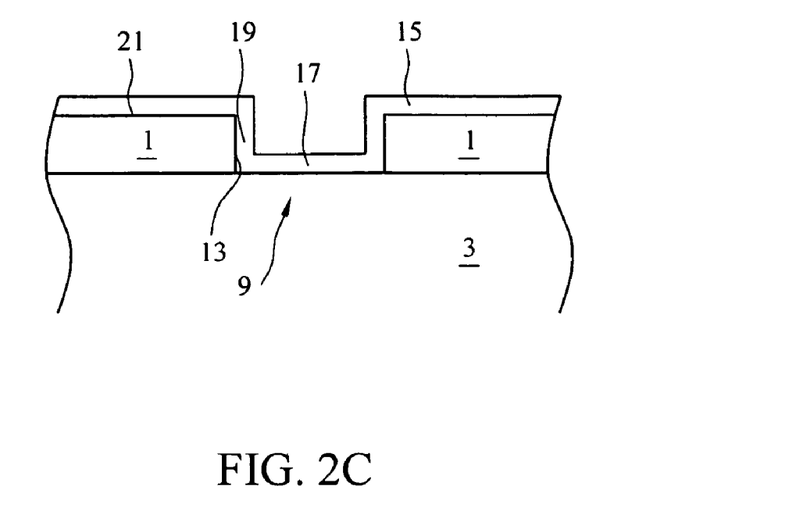

An etching process is used to form opening 7 within organic material 1 and a subsequent ashing process may be used to remove photoresist 5 and clean up any residual organic material from gate area 9 to produce the structure shown in FIG. 2B which illustrates bottom 11 and sidewalls 13 of opening 7. Conventional etching and ashing methods may be used. The ashing procedure may minimally remove some thickness of organic material 1 as well. FIG. 2C shows the structure of 2B after high-k gate dielectric 15 has been formed over organic material 1 and within opening 7. Various high-k dielectric materials may be used. For example, high-k gate dielectric 15 may be $Al_xN_y$, $LaAl_xO_y$, $HfO_xN_y$, $SiO_xN_y$, $Al_xO_y$, $Zr_xO_y$, $Hf_xOy$, $La_xO_y$, $La_xO_y$ or $Y_xO_y$, but other suitable high-k dielectric materials may be used in other embodiments. High-k gate dielectric 15 may include a thickness within the range of 5–300 angstroms in one exemplary embodiment, but other thicknesses may be used in other exemplary embodiments. High-k gate dielectric 15 is formed over top surface 21 of organic material 1 and also includes side portions 19 and bottom portion 17 disposed within opening 7.

Figure 2D:
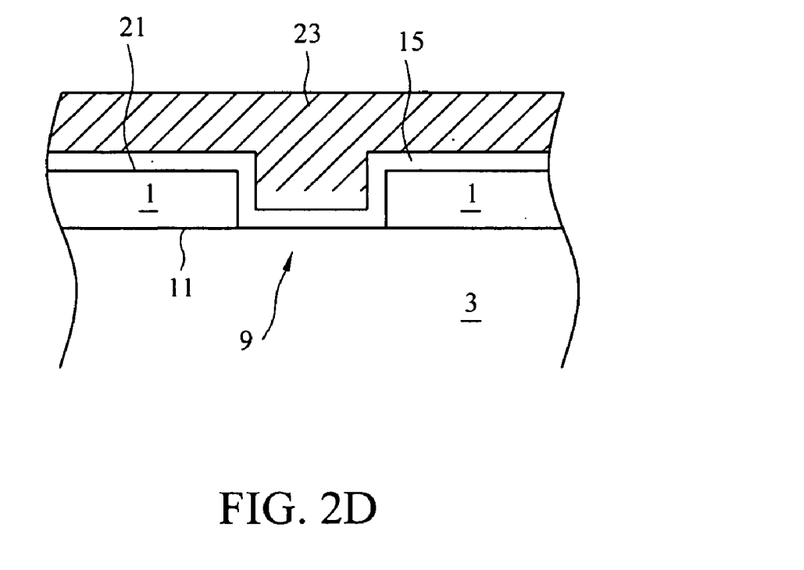
Figure 2E:
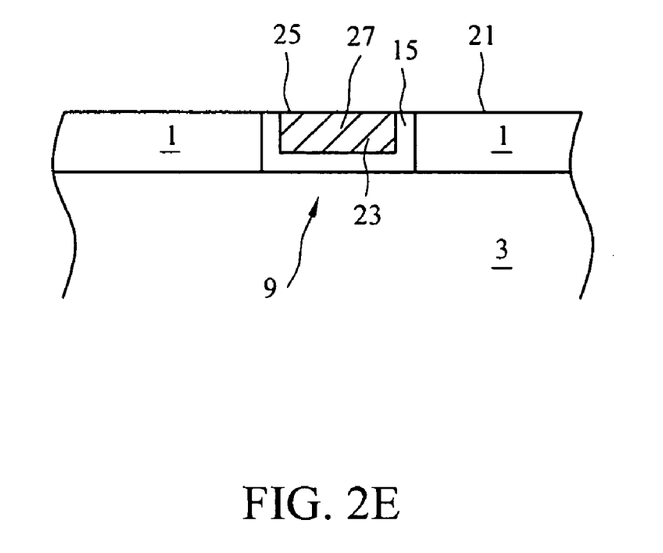
Figure 2F:
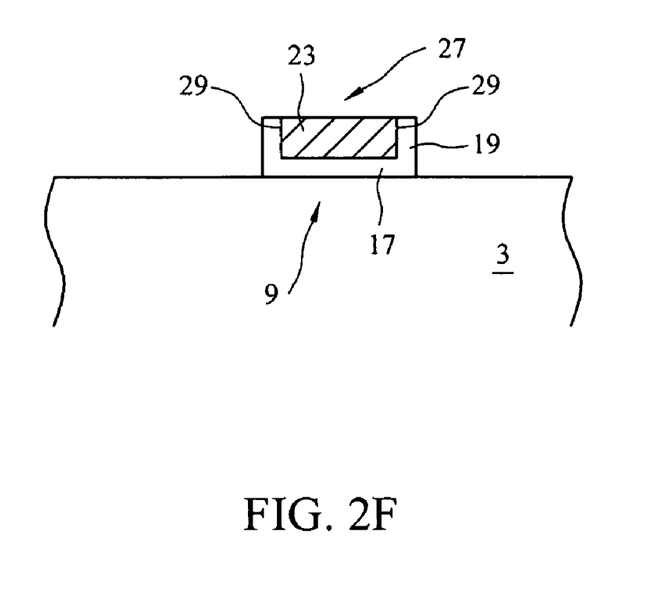

Now turning to FIG. 2D, conductive material 23 is formed over high-k gate dielectric 15. More particularly, conductive material 23 fills opening 7 and also extends over top surface 21 of organic material 1. Conductive material 23 may be a metal such as Al, Cu, Ti, Ta, Mo, Ru, W, Pt or alloys of two or more of the aforementioned metallic elements. Conductive material 23 may also include a metal nitride or silicide formed of the aforementioned metallic elements. For example, $CoSi_x$ or NiSi may be used. A planarization step such as a conventional chemical mechanical polishing (CMP) process is then used to remove materials from over top surface 21 of organic material 1 and form substantially planar top surface 25 such as shown in FIG. 2E. FIG. 2E shows gate structure 27 composed of high-k gate dielectric 15 and conductive material 23 formed in gate region 9. A conventional ashing process may then be used to selectively remove organic material 1 from regions other than gate region 9, producing the structure shown in FIG. 2F. Gate structure 27 includes conductive material 23 and high-k gate dielectric 15. Bottom portion 17 of high-k gate dielectric 15 is disposed between conductive material 23 and substrate 3 in gate region 9 and side portions 19 of high-k gate dielectric 15 extend along sidewalls 29 of conductive material 23. Side portions 19 are substantially orthogonal to the substrate surface and bottom portion 17. Subsequent conventional processing operations may then be carried out upon the structure shown in FIG. 2F to form self-aligned or other source and drain regions and further components to form a transistor.

Figure 3A:
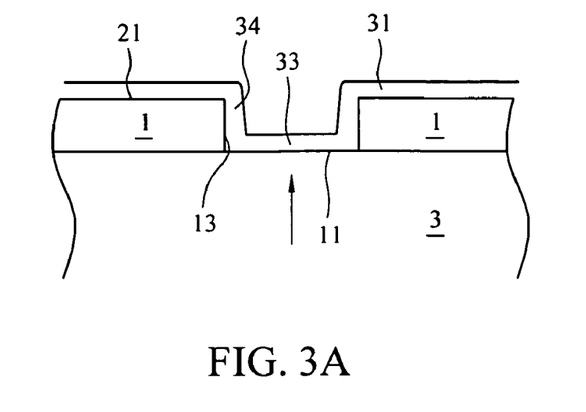
FIGS. 3A–3C illustrate a variation of the process sequence shown in FIGS. 2A–2F.
Figure 3B:
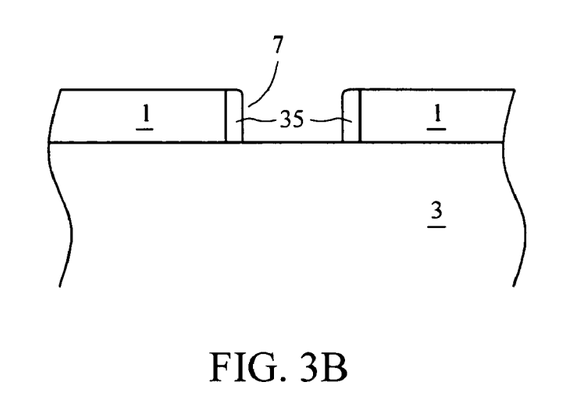
Figure 3C:
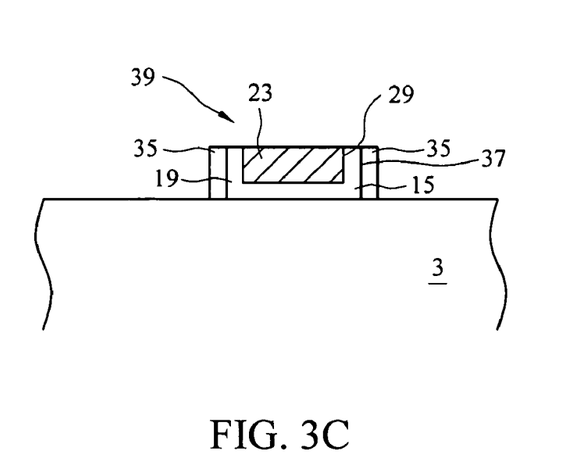

FIGS. 3A–3C show a variation of the process sequence shown in FIGS. 2A–2F. After the structure shown in FIG. 2B is formed, barrier layer 31 may be formed over top surface 21 of organic material 1 and within opening 7 as shown in FIG. 3A. Barrier material 31 may be a metal nitride, $SiO_xN_y$, $SiN_x$, $SiO_x$, $SiC_x$, $SiO_xC_y$ or various other suitable and conventional barrier materials and includes bottom portions 33 and side portions 34. An anisotropic etching process may be used to remove the bulk of barrier material 31, including portions over top surface 21 of organic material 1 and bottom portion 33, to produce residual side sections 35 of barrier material 31. Side sections 35 line opening 7 and the structure including opening 7 and the structure including opening 7 may then be further processed as shown in FIGS. 2C–2E to produce the structure shown in FIG. 3C. In FIG. 3C, gate structure 39 includes conductive material 23 and high-k gate dielectric 15 below conductive material 23 and along sidewalls 29 of conductive material 23. Sections 35 of barrier material are formed along sidewalls 37 of high-k gate dielectric 15 and may alternatively be referred to as a buffer layer or material.

Figure 4A:
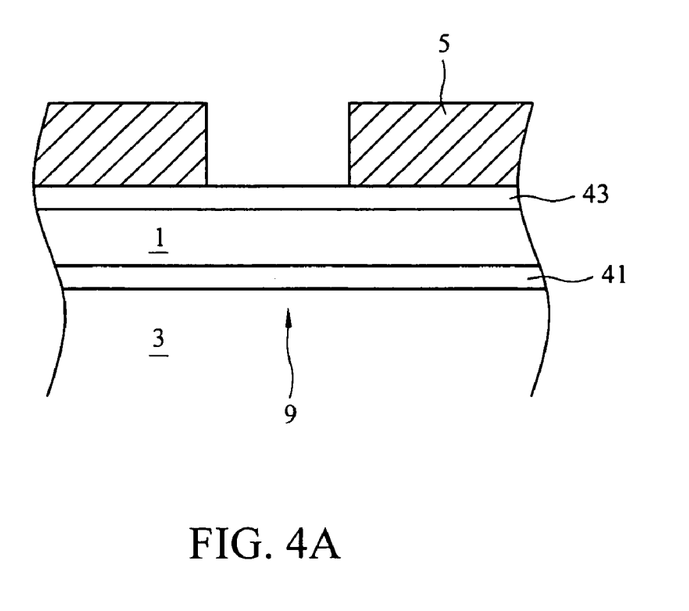
FIGS. 4A–4F illustrate an exemplary process sequence to form a transistor gate according to the invention.
Figure 4B:
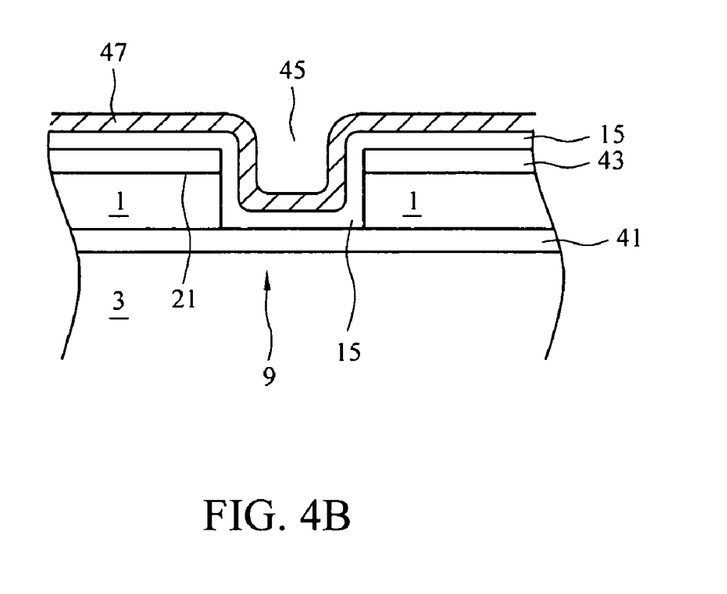
Figure 4C:
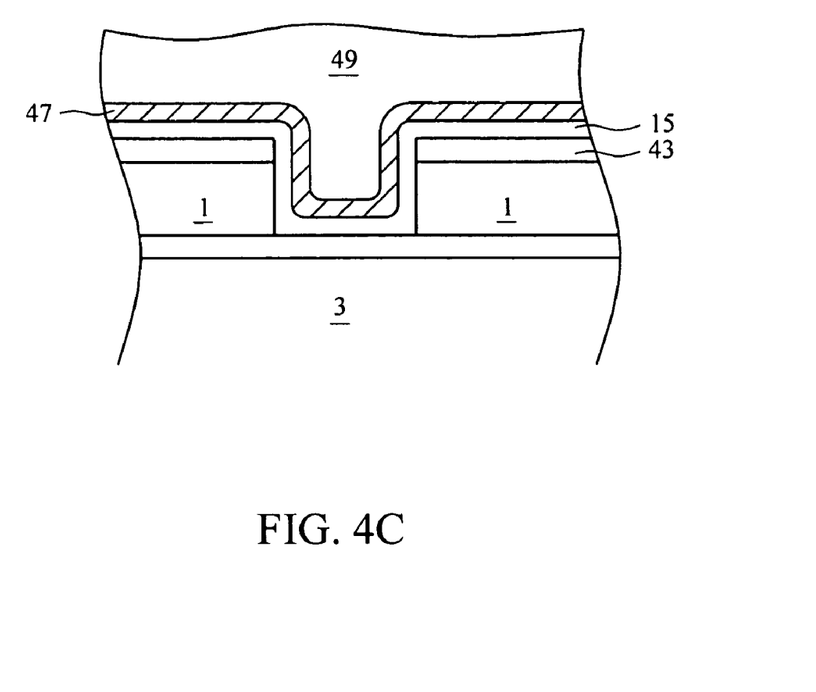
Figure 4D:
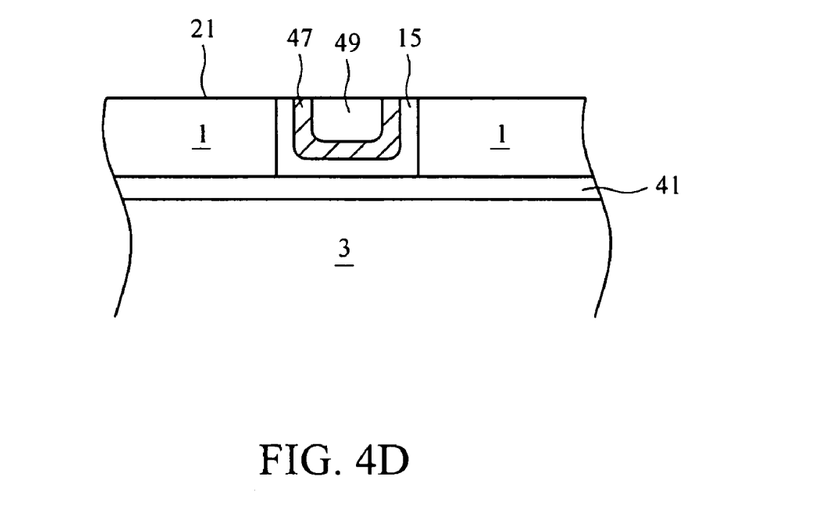
Figure 4E:
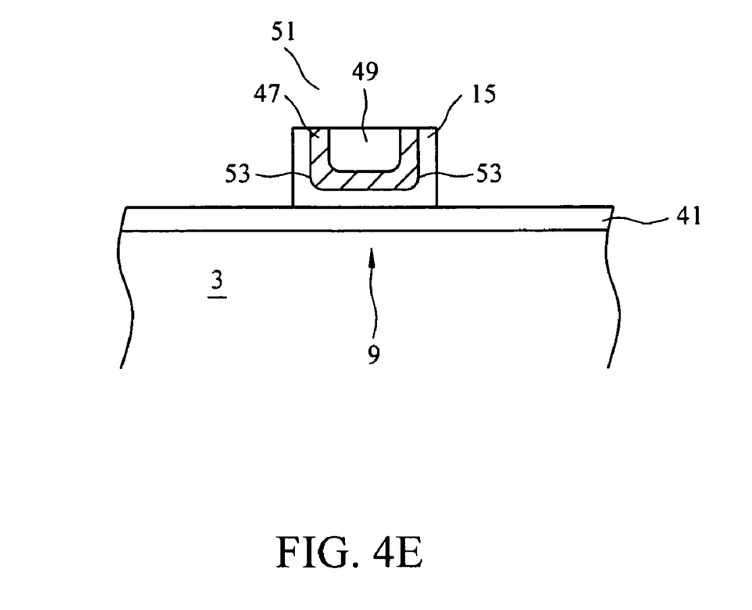
Figure 4F:
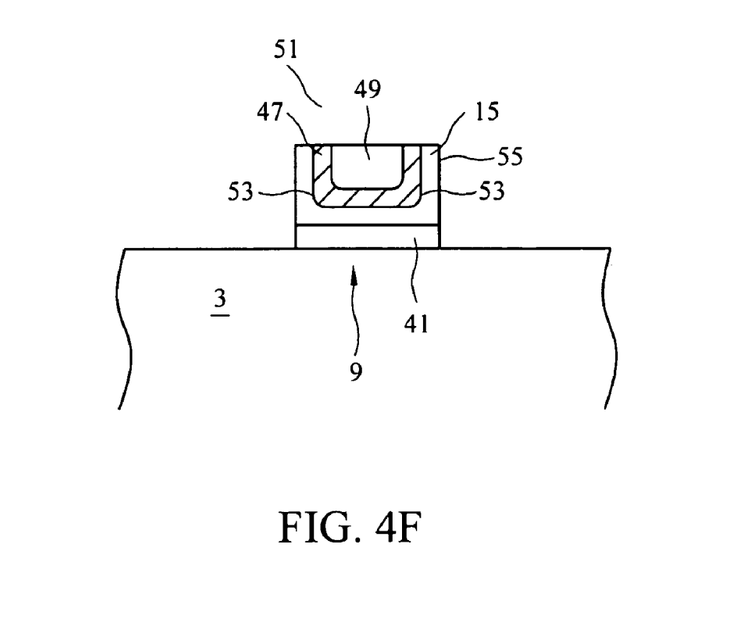

FIGS. 4A–4F show a sequence of processing operations to form other exemplary embodiments of the semiconductor device of the invention. In FIG. 4A, ARC (antireflective coating) 43 is formed over organic material 1 and gate dielectric 41 is formed over substrate 3 and beneath organic material 1. Gate dielectric 41 may be an oxide such as $SiO_2$, SiON, or a nitrogen-treated oxide. Other conventional gate dielectric materials may be used for gate dielectric 41. Each of gate dielectric 41 and ARC 43 are optional. FIG. 4B shows opening 45 extending through ARC 43 and organic material 1. High-k gate dielectric 15 is formed within opening 45 and over ARC 43. First conductive layer 47 is formed over high-k gate dielectric 15 including over non-gate portions of organic material 1 and within opening 45. First conductive layer 47 may be various suitable metals such as aluminum, copper, Ti, Ta, Mo, Ru, W, Pt or various alloys or nitrides thereof. Conventional formation methods may be used to form substantially conformal first conductive layer 47.

Second conductive layer 49 may be polysilicon, one of the aforementioned metals, or a metal silicide. Second conductive material 49 is formed over first conductive material 41 and fills opening 45. A planarization process such as a chemical mechanical polishing process is then used to remove portions of second conductive material 49, first conductive layer 47, high-k gate dielectric 15 and ARC 43 from over top surface 21 of organic material 1 to form the planarized structure shown in FIG. 4D. An ashing processing is then used to selectively remove organic material 1 and produce the structure shown in FIG. 4E which includes gate structure 51 which includes a conductive portion formed of first conductive material 47 and second conductive material 49 with high-k gate dielectric 15 extending along sidewalls 53 of the conductive materials and beneath the conductive portion. A conventional selective etch process may then be used to remove portions of gate dielectric 41 outside of gate region 9 and produce the structure shown in FIG. 4F. Gate structure 51 includes gate dielectric 41 formed between high-k gate dielectric 15 and substrate 3.

The various features illustrated in FIGS. 2A–2F, 3A–3C and 4A–4F may be used in various other combinations. For example, gate structure 51 shown in FIG. 4F, may also include a barrier material along outer sidewalls 55. Similarly, the multi-layer conductive material shown in FIGS. 4C–4F may also be used in conjunction with an embodiment that does not include gate dielectric 41.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom " as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device comprising:
   forming a layer of organic material over a substrate including over a gate region and selectively removing said layer of organic material from over said gate region thereby producing an opening in said layer of organic material over said gate region,
   forming a high-k gate dielectric material in said opening and over said layer of organic material;
   using a planarizing operation to remove said high-k gate dielectric material from regions that are not said gate region; and
   forming a conductive material over said high-k gate dielectric material in said gate region.

2. The method as in claim 1, further comprising forming a further gate dielectric material beneath said high-k gate dielectric material in said gate region, said further gate dielectric material being one of SiO2, SION and nitrogen-treated SiO2.

3. The method as in claim 1, wherein said forming a high-k gate dielectric material comprises forming a bottom, substantially planar portion parallel said substrate and forming side portions at ends of said gate region, said side portions extending generally orthogonal to said substrate and
   said conductive material is disposed between said side portions.

4. The method as in claim 1, wherein said planarizing operation removes said high-k gate dielectric material from over said layer of organic material.

5. The method as in claim 4, wherein said forming a conductive material over said high-k gate dielectric material comprises said conductive material filling said opening and extending over said layer of organic material, and wherein said planarizing operation further removes said conductive material from over said layer or organic material.

6. The method as in claim 5, wherein said conductive material comprises a metal layer and a silicide layer.

7. The method as in claim 1, wherein said forming a high-k gate dielectric material comprises forming a high-k gate dielectric film on a bottom and sides of said opening but not filling said opening.

8. The method as in claim 7, wherein said planarizing operation removes said high-k gate dielectric film from over said layer of organic material and further comprising subsequently removing said layer of organic material from said regions that are not said gate region.

9. The method as in claim 8, further comprising forming a gate oxide material beneath said high-k gate dielectric material in said gate region, and wherein said subsequently removing further comprises removing said gate oxide from said regions that are not said gate region.

10. The method as in claim 1, further comprising forming an antireflective coating over said layer of organic material and wherein said selectively removing comprises etching to form said opening and removes said antireflective coating from said gate region.

11. The method as in claim 1, further comprising forming a buffer layer of one of a metal nitride, $SiN_x$, $SiO_xN_y$, $SiO_x$, $SiC_x$ and $SiO_xC_y$, on sidewalls of said opening prior to said forming a high-k dielectric material.

12. The method as in claim 11, wherein said forming a buffer layer comprises forming said buffer layer on said sidewalls and a bottom of said opening and over said layer of organic material, then etching to remove said buffer layer from said bottom and from over said layer of organic material.

13. The method as in claim 1, wherein said planarizing operation comprises chemical mechanical polishing.

14. The method as in claim 1, wherein said organic material comprises an organic low dielectric constant spin-on-polymer (SOP).

* * * * *

UNITED STATES PATENT AND TRADEMARK OFFICE
CERTIFICATE OF CORRECTION

| | | |
|---|---|---|
| PATENT NO. | : 7,179,701 B2 | Page 1 of 1 |
| APPLICATION NO. | : 10/946494 | |
| DATED | : February 20, 2007 | |
| INVENTOR(S) | : Ju-Wang Hsu, Jyu-Horng Shieh and Ju-Chien Chiang | |

It is certified that error appears in the above-identified patent and that said Letters Patent is hereby corrected as shown below:

Column 6, line 14, delete "or" and insert therefore -- of --.

Signed and Sealed this

Thirty-first Day of July, 2007

JON W. DUDAS
*Director of the United States Patent and Trademark Office*